United States Patent [19]
Luo

[11] Patent Number: 6,154,098
[45] Date of Patent: Nov. 28, 2000

[54] GAIN-ADJUSTABLE VOLTAGE-CONTROLLED OSCILLATOR

[75] Inventor: Wenzhe Luo, Allentown, Pa.

[73] Assignee: Lucent Technologies, Inc., Murray Hill, N.J.

[21] Appl. No.: 09/157,276

[22] Filed: Sep. 18, 1998

[51] Int. Cl.$^7$ ........................................................ H03B 1/00
[52] U.S. Cl. ........................ 331/57; 331/177 R; 331/175; 327/105
[58] Field of Search .................................. 331/57, 177 R, 331/175; 327/105, 264, 261, 270, 272

[56] References Cited

U.S. PATENT DOCUMENTS

| | | | |
|---|---|---|---|
| 4,859,970 | 8/1989 | Matsuo et al. | 331/57 |
| 5,438,301 | 8/1995 | Havens et al. | 331/45 |
| 5,559,476 | 9/1996 | Zhang et al. | 331/57 |

*Primary Examiner*—Arnold Kinkead
*Assistant Examiner*—Kimberly E Glenn
*Attorney, Agent, or Firm*—Schnader Harrison Segal & Lewis

[57] ABSTRACT

The present invention includes a voltage control circuit having at least one voltage-controlled oscillator and at least one voltage controller connected to the voltage controlled oscillator. The voltage controller has at least one voltage input for supplying an input voltage to the voltage controller, a control signal input for supplying a control signal to the voltage controller, and a voltage output connected to the voltage controlled oscillator for supplying an output voltage thereto. The output voltage controls the delay of the voltage controller oscillator by supplying the control signal to the voltage controller. The voltage-controlled oscillator may include a multiple inverted stage ring oscillator and the voltage controller may include at least one PMOS T-gate circuit having a fixed positive voltage input, a positive adjustable control voltage input, and a control signal input; and at least one NMOS T-gate circuit having a fixed negative voltage input, a negative adjustable control voltage input, and a control signal input. Applications of the voltage-controlled oscillator include frequency synthesizers comprising frequency oscillator circuitry, digital signal processors, and cellular phones comprising digital processing circuitry.

27 Claims, 2 Drawing Sheets

GAIN-ADJUSTABLE VOLTAGE-CONTROLLED OSCILLATOR

BACKGROUND OF THE INVENTION

1. Field of the Invention

The present invention is directed to voltage-controlled oscillator, and more particularly to a gain-adjustable voltage controlled oscillator used in Voltage control circuit design for the controlled oscillation and output of a desired frequency.

2. Description of the Prior Art

In conventional Phase-Locked Loop (PLL) circuits, a voltage controlled oscillator (VCO) is used for generating an oscillation. The parameters of the VCO, such as the frequency gain (Ko) and the frequency range directly affect the loop characteristics and the output frequency range of the PLL.

The VCO has traditionally been designed in a number of different ways. The most popular design is the ring oscillator, which consists of an odd number of inverting stages connected in a ring. A state voltage controls the delay of each stage, and the VCO toggling frequency is controlled accordingly. The state voltage is the result of the PLL feedback comparison. The PLL circuit compares the VCO frequency (or a fraction thereof) against the reference clock, making adjustments to the state voltage dynamically to tune the VCO frequency to the desired value.

The frequency gain (Ko) of a VCO is the ratio of the increment of the VCO angular frequency by the state voltage adjustment $((\delta\omega)/(\delta V)$, in rad/s/V). As Ko increases, VCO becomes more sensible to the state voltage change. In designing PLL circuits, the frequency gain Ko is one of the most important parameters to determine the PLL characteristics and must be designed within the proper range.

However, the current use of a distributed fabrication process for the design and manufacture of PLL circuits and the use of PLL circuits in diverse application situations (e.g. 5V/3V choices, etc.) typically results in a frequency gain which may deviate severely from the expected range. Accordingly, a voltage control circuit is needed which is adjustable after fabrication so that it could be tuned to the proper range based upon field measurements.

SUMMARY OF THE INVENTION

The present invention includes a voltage control circuit having at least one voltage-controlled oscillator and at least one voltage controller connected to the voltage controlled oscillator. The voltage controller has at least one voltage input for supplying an input voltage to the voltage controller, a control signal input for supplying a control signal to the voltage controller, and a voltage output connected to the voltage controlled oscillator for supplying an output voltage thereto. The output voltage controls the delay of the voltage controller oscillator by supplying the control signal to the voltage controller. The voltage controlled oscillator may include a multiple inverted stage ring oscillator and the voltage controller may include at least one PMOS T-gate circuit having a fixed positive voltage input, a positive adjustable control voltage input, and a control signal input; and at least one NMOS T-gate circuit having a fixed negative voltage input, a negative adjustable control voltage input, and a control signal input.

DETAILED DESCRIPTION OF THE INVENTION AND THE PREFERRED EMBODIMENTS

The present invention will be understood more fully from the detailed description given below and from accompanying drawings of preferred embodiments of the invention, which, however, should not be taken to limit the invention to a specific embodiment, but are for explanation and understanding only.

The adjustable frequency gain PLL circuit of the present invention provides significant advantages over conventional PLL systems in that, through digital control, the present invention provides programmability to the VCO gain. And, through the adjustment of the control voltage, it also provides the adjustability to the frequency range of the oscillator.

This flexibility enables the VCO (Voltage-Controlled-Oscillator) of the present invention to be adjusted to the best work point even if the fabrication process causes component deviations. Thus, the actual yield is significantly improved. Moreover, when the VCO is used in a PLL, through the VCO adjustment provided by this design, the PLL loop characteristics could be optimized to the best point.

Thus, a PLL in accordance with the present invention gives significantly improved noise performance and converging features when used in a number of applications, including but not limited to use in frequency synthesizers (e.g. for clock generation, frequency modulation, demodulation, and synchronization), or use in digital signal processors for programmable devices used in cell phones or digital tags.

Figure 1A:
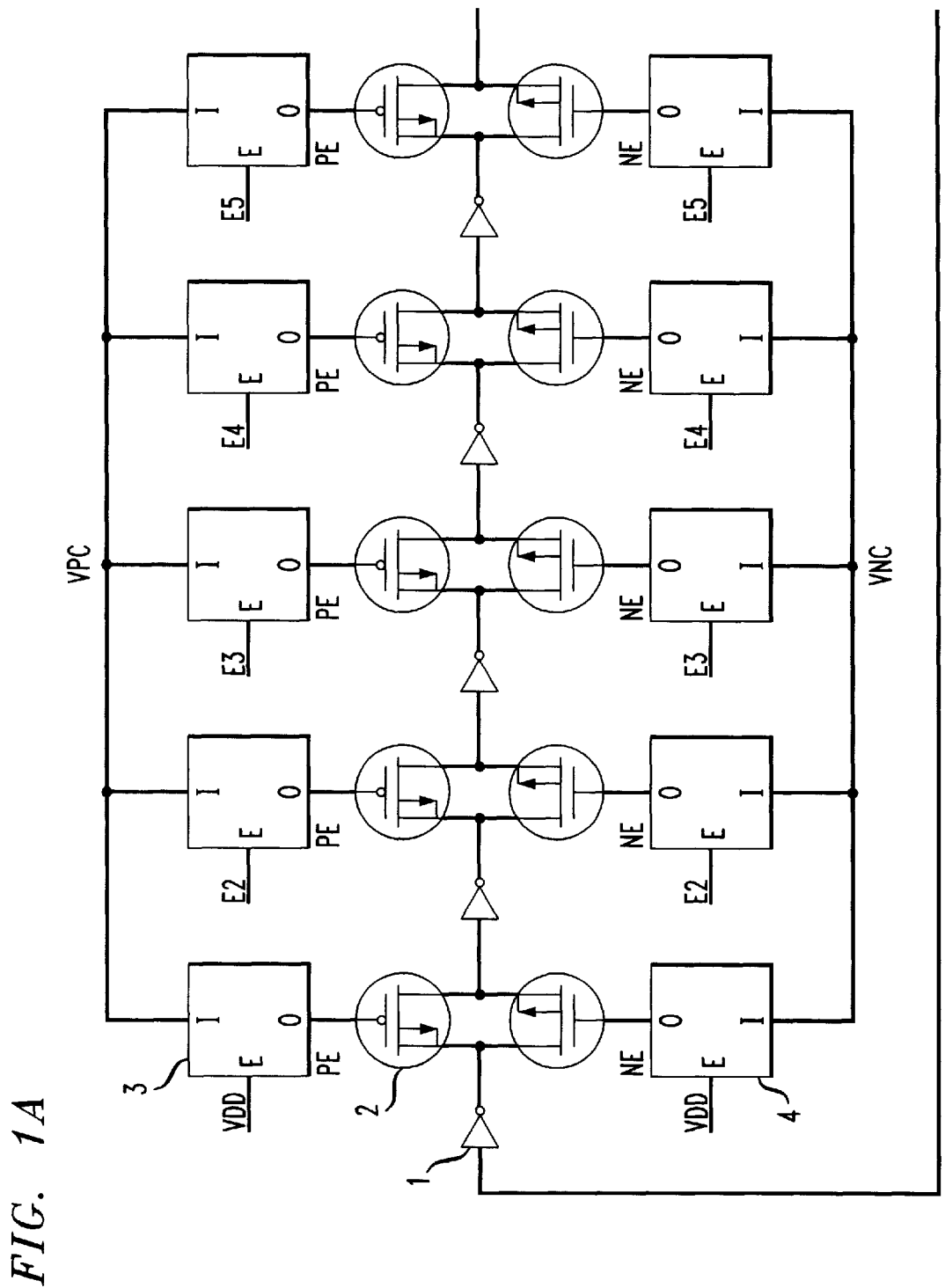
FIG. 1(a) is a schematic illustrating a preferred embodiment of the present invention incorporating a multiple inverted stage ring oscillator.

As shown in FIG. 1, one preferred embodiment of the present invention incorporates a multiple inverted stage voltage controlled ring oscillator. The preferred embodiment in FIG. 1(a) includes five stages. Each stage includes a feedback comparison circuit having an operational amplifier 1 and T-gate 2 connected in a conventional manner. T-gate 2 preferably comprises Metal Oxide Semiconductors (MOSs) which can be doped positive (PMOS) or negative (NMOS) depending on the application. The inverting stages may, of course, comprise any number of integrated circuit chips, which are well known to those of ordinary skill in the art.

Figure 1B:
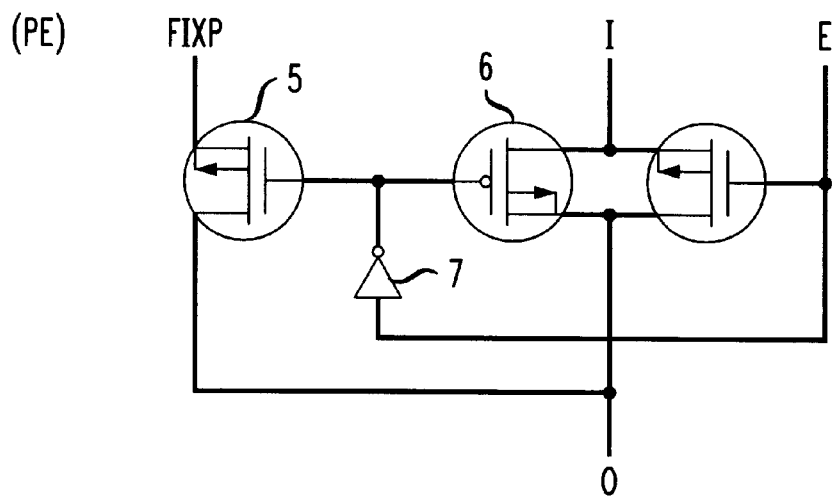
FIG. 1(b) is a schematic illustrating a PMOS T-gate voltage controller in accordance with a preferred embodiment of the present invention.
Figure 1C:
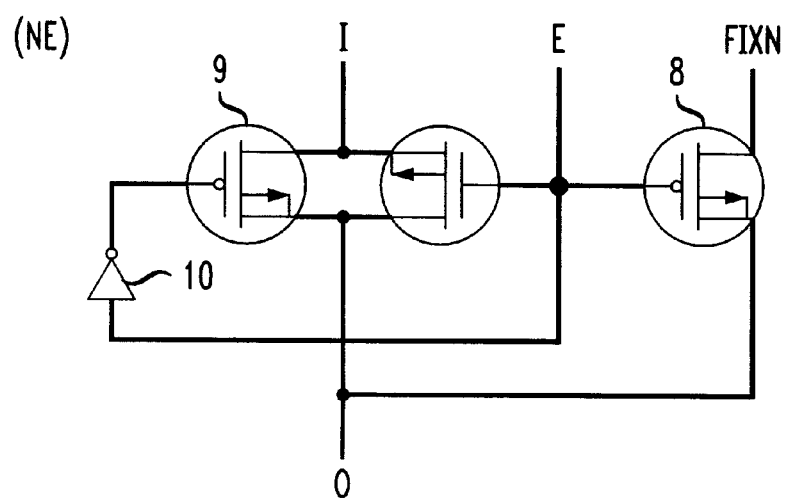
FIG. 1(c) is a schematic illustrating a NMOS T-gate voltage controller in accordance with a preferred embodiment of the present invention.

In the preferred embodiment shown in FIG. 1, each stage has a T-gate input connected to positive voltage controller (PE) 3 and a negative voltage controller (NE) 4. A preferred embodiment of each voltage controller is shown in FIGS. 1(b) and 1(c). FIG. 1(b) shows a preferred embodiment of the positive voltage controller, having PMOS gate 5 providing input to PMOS T-gate 6. An operational amplifier 7 is used to establish a feedback loop, well known to those of ordinary skill in the art. A positive control voltage (VPC) is provided to input I of T-gate 6. A fixed positive voltage is applied to PMOS 5, and a control signal voltage is inputted to the positive voltage controller at input E.

Similarly, as shown in FIG. 1(c), the negative voltage controller has NMOS gate. Operational amplifier 10 is used to establish a conventional feedback circuit. A negative control voltage (VNC) is provided to input I of T-gate 9. A fixed negative voltage is applied to NMOS 8, and a control signal voltage is inputted to the negative voltage controller at input E.

The system of the present invention operates as follows. A preset voltage, VDD is supplied to input E of the positive and negative voltage controllers in the first stage of the VCO circuit. Voltages VPC and VNC preferably control the first stage. The remaining stages, however, are programmable by control signal voltages E2, E3, E4, and E5 inputted to the positive and negative voltage controllers.

Each positive voltage controller connects VPC to its stage of the VCO through output O (connected to the input of T-gate 2) when the control signal at input Ei (where i=2, 3, 4, 5) is high. Each negative voltage controller acts in the same manner. When the control signal at Ei is low, however, the positive and negative voltage controllers input the fixed control voltages, FIXP and FIXN, respectively, to its stage of the VCO. This leaves PMOS 5 and NMOS 8 in a constant conduction state.

Thus, for each of stages 2–5, when Ei is high, the delay of that stage is under the control of VPC and VNC. Conversely, when Ei is low, the delay for that stage is fixed and unadjustable by VPC and VNC. Accordingly, stages 2–5 are programmable for Ko adjustment.

An embodiment of the present invention used as a digital signal processor may include processor logic, such as a microprocessor, associated Read Only Memory (ROM), and possibly dynamic memory, such as Random Access Memory (RAM) which is well known to one of ordinary skill in the art, and a voltage control circuit, such as described above. An embodiment of the present invention in a cellular phone may include this digital signal processing circuitry, cellular transceiver circuitry (which is well known to those of skill in the art), and a voltage control circuit, such as described above.

An embodiment of the present invention used as a frequency synthesizer may incorporate frequency oscillator circuitry, such as a crystal oscillator and associated biasing circuitry, well known to those of ordinary skill in the art, a voltage control circuit, such as described above, and output circuitry, such as modulation logic, demodulation logic, or synchronization logic, such as that found in large scale integrated logic chips or discrete logic circuits, all of which are well known to those of skill in the art.

While this invention has been described in conjunction with specific embodiments thereof, it is evident that many alternatives, modifications, and variations will be apparent to those skilled in the art. Accordingly, the preferred embodiments of the invention set forth herein are intended to be illustrative, not limiting. Various changes may be made without departing from the spirit and scope of the invention as defined in the appended claims.

What is claimed is:

1. A voltage control circuit comprising:
   at least one voltage controlled oscillator; and
   at least one voltage controller connected to said voltage controlled oscillator, said voltage controller comprising:
   a) at least one PMOS T-gate circuit having a fixed positive voltage input, a positive adjustable control voltage input, and a control signal input for supplying a control signal to the PMOS T-gate circuit,
   b) at least one NMOS T-gate circuit having a fixed negative voltage input, a negative adjustable control voltage input, and a control signal input for supplying the control signal to the NMOS T-gate circuit,
   c) a positive voltage output connected to said voltage controlled oscillator and said PMOS T-gate circuit for supplying an output voltage to said voltage controlled oscillator, and
   d) a negative voltage output connected to said voltage controlled oscillator and said NMOS T-gate circuit for supplying an output voltage to said voltage controlled oscillator;
   wherein a delay of said voltage controller oscillator is controlled by said positive voltage output and said negative voltage output by supplying said control signal to said voltage controller.

2. The voltage control circuit of claim 1, wherein said voltage controlled oscillator comprises a ring oscillator.

3. The voltage control circuit of claim 1, wherein said voltage controlled oscillator comprises a multiple inverted stage ring oscillator.

4. The voltage control circuit of claim 3, wherein said multiple inverted stage ring oscillator has five stages.

5. A frequency synthesizer comprising the voltage control circuit of claim 1.

6. A digital signal processor comprising the voltage control circuit of claim 1.

7. A cellular phone comprising the voltage control circuit of claim 1.

8. A voltage control circuit comprising:
   (a) at least one voltage controlled ring oscillator;
   (b) a positive voltage controller comprising:
     i) a PMOS T-gate circuit comprising a control signal input for supplying a control signal to said positive voltage controller, a fixed positive voltage input and a positive adjustable control voltage input, each voltage input for supplying an input voltage to said positive voltage controller, and
     ii a positive voltage output connected to said voltage controlled oscillator for supplying an output voltage thereto;
   (c) a negative voltage controller comprising:
     i) an NMOS T-gate circuit comprising a control signal input for supplying the control signal to said negative voltage controller, a fixed negative voltage input and a negative adjustable control voltage input, each voltage input for supplying an input voltage to said negative voltage controller, and
     ii) a negative voltage output connected to said voltage controlled oscillator for supplying a negative output voltage thereto;
   wherein the delay of said voltage controller ring oscillator is controlled by said positive and said negative output voltages by supplying said control signal to said positive voltage controller and said negative voltage controller.

9. The voltage control circuit of claim 8, wherein said voltage controlled ring oscillator comprises a multiple inverted stage ring oscillator.

10. The voltage control circuit of claim 9, wherein said multiple inverted stage ring oscillator has five stages.

11. A frequency synthesizer comprising the voltage control circuit of claim 8.

12. A digital signal processor comprising the voltage control circuit of claim 8.

13. A cellular phone comprising the voltage control circuit of claim 8.

14. A voltage controller comprising:
    an gate comprising;
    a T-gate;

a control voltage input for supplying a control voltage to the T-gate;

a fixed voltage gate;

a fixed voltage input for supplying a fixed voltage to the fixed voltage gate;

a control signal input connected to the T-gate and the fixed voltage gate, the control signal input for supplying a digital control signal to the T-gate and the fixed voltage gate; and an output connected to the fixed voltage gate and the T-gate, the output adapted to supply an output voltage to a stage of a multistage oscillator circuit, the output voltage selected in response to the control signal, wherein the output voltage is the control voltage when the control signal is high and wherein the output voltage is the fixed voltage when the control signal is low.

15. A frequency synthesizer comprising the voltage controller of claim 14.

16. A digital signal processor comprising the voltage controller of claim 14.

17. A cellular phone comprising the voltage controller of claim 14.

18. A gain adjustable voltage controlled oscillator comprising:

at least two oscillator stages;

a positive voltage controller connected to each of said stages, each positive voltage controller comprising a T-gate;

a positive control voltage input connected to the T-gate for supplying a positive control voltage to the T-gate;

a fixed positive voltage gate;

a fixed positive voltage input connected to the fixed positive voltage gate for supplying a fixed positive voltage to the fixed positive voltage gate;

a control signal input connected to the T-gate and the fixed positive voltage gate, the control signal input for supplying a digital control signal to the T-gate and the fixed positive voltage gate; and an output connected to the fixed positive voltage gate and the T-gate, the output adapted to supply a positive output voltage to one of the at least two oscillator stages, the positive output voltage selected in response to the digital control signal, wherein the output voltage is the positive control voltage when the control signal is high and wherein the output voltage is the fixed negative voltage when the control signal is low; and a negative voltage controller connected to each stage, each negative voltage controller comprising a T-gate;

a negative control voltage input connected to the T-gate for supplying a negative control voltage to the T-gate;

a fixed negative voltage gate;

a fixed negative voltage input connected to the fixed negative voltage gate for supplying a fixed negative voltage to the fixed negative voltage gate;

a control signal input connected to the T-gate and the fixed negative voltage gate, the control signal input for supplying the digital control signal to the T-gate and the fixed negative voltage gate; and an output connected to the fixed negative voltage gate and the T-gate, the output adapted to supply a negative output voltage to one of the at least two oscillator stages, the negative output voltage selected in response to the digital control signal, wherein the output voltage is the negative control voltage when the control signal is high and wherein the output voltage is the fixed negative voltage when the control signal is low.

19. A frequency synthesizer comprising the gain adjustable voltage controlled oscillator of claim 18.

20. A digital signal processor comprising the gain adjustable voltage controlled oscillator of claim 18.

21. A cellular phone comprising the gain adjustable voltage controlled oscillator of claim 18.

22. A multi-staged voltage controlled oscillator comprising:

a plurality of stages, each stage comprising a feedback comparison circuit, a positive gate having a control signal input, the positive gate connected to the feedback comparison circuit and adapted to selectively connect a positive control voltage to the feedback comparison circuit in response to a digital control signal, and a negative gate having a control signal input, the negative gate connected to the feedback comparison circuit and adapted to selectively connect a negative control voltage to the feedback comparison circuit in response to the digital control signal;

wherein each stage of the multi-staged voltage controlled oscillator is enabled by introducing a high control signal to the positive gate control signal input and the negative gate control signal input, and wherein a frequency and a gain of the multi-staged voltage controlled oscillator is directly related to a number of the plurality of stages that are enabled and is adjustable by enabling at least one of a predetermined number of the plurality of stages.

23. The multi-staged voltage controlled oscillator of claim 22 wherein the positive gate further comprises a T-gate.

24. The multi-staged voltage controlled oscillator of claim 22 wherein the negative gate further comprises a T-gate.

25. A frequency synthesizer comprising the multi-staged voltage controlled oscillator of claim 22.

26. A digital signal processor comprising the multi-staged voltage controlled oscillator of claim 22.

27. A cellular phone comprising the multi-staged voltage controlled oscillator of claim 22.

* * * * *